United States Patent
Suzuki

(10) Patent No.: US 6,431,800 B1
(45) Date of Patent: Aug. 13, 2002

(54) EDGED CERAMIC MEMBER AND A METHOD OF MANUFACTURING SAME

(75) Inventor: Keiji Suzuki, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 09/497,514

(22) Filed: Feb. 4, 2000

(30) Foreign Application Priority Data

May 31, 1999 (JP) .......................... 11-152456

(51) Int. Cl.$^7$ .......................... B23B 27/16; C04B 35/00
(52) U.S. Cl. .......................... 407/119; 407/118; 264/642; 501/102
(58) Field of Search .......................... 407/118, 119; 408/144, 145; 427/226, 397.7; 264/621, 342, 671; 501/103, 102, 98.1, 98.2

(56) References Cited

U.S. PATENT DOCUMENTS

| | | | |
|---|---|---|---|
| 4,331,048 A | * 5/1982 | Dworak et al. | 82/1.11 |
| 5,141,367 A | * 8/1992 | Beeghly et al. | 407/119 |
| 5,635,120 A | * 6/1997 | Long et al. | 264/621 |
| 5,804,131 A | 9/1998 | Majumdar et al. | |
| 5,854,158 A | * 12/1998 | Nawa et al. | 501/104 |
| 6,139,791 A | * 10/2000 | Chen et al. | 264/462 |

FOREIGN PATENT DOCUMENTS

| | | |
|---|---|---|
| EP | 0 253 934 | 1/1988 |
| EP | 0 294 844 | 12/1988 |
| EP | 0 834 484 | 4/1998 |
| JP | 4-275977 | 10/1992 |
| JP | 2671929 | 7/1997 |
| JP | 9-221358 | 8/1997 |
| WO | WO 90/05045 | 5/1990 |

OTHER PUBLICATIONS

European Search Report for EP 00300392 dated Jun. 12, 2001.

* cited by examiner

Primary Examiner—Henry Tsai
(74) Attorney, Agent, or Firm—Sughrue Mion, PLLC

(57) ABSTRACT

A ceramic member is constituted with a zirconia-containing ceramic material containing 20% by volume or more of a zirconia series ceramic phase mainly composed of a zirconium oxide. The zirconia-containing ceramic material satisfies:

$$KC/(d^A) \geq 5$$

by using an exponential value A set within a range from −0.41 to −0.37 width, d being an average grain size (unit: $\mu$m) and KC being a fracture toughness value (unit: $MPa \cdot m^{1/2}$). An edge portion appearing in the form of a ridge is formed at an intersection between two edge forming surfaces 4a and 5 to the outer surface of the member, and the edge portion is formed as a sharp edge portion E having a width w of 0.15 mm or less for the top end of the edge appearing on a cross section taken along an arbitrary plane in perpendicular to the direction of the ridge.

6 Claims, 9 Drawing Sheets

EDGED CERAMIC MEMBER AND A METHOD OF MANUFACTURING SAME

BACKGROUND OF THE INVENTION

1. Field of the Invention

The present invention concerns an edged ceramic member, and a manufacturing method thereof, a punch used for lead frames and a method of manufacturing lead frames.

2 Discussion of the Prior Art

Since zirconia series ceramics can develop toughness not found in usual ceramics, as a result of a stress relaxation mechanism based on stress-induced transformation of a partially stabilized zirconia phase, their application has made progress, for example, in molds or tools used for shearing such as punching or cutting or deep drawing, as well as in cutlery such as scissors or cooking knives.

Further, since such zirconia series ceramics can be improved in various characteristics inherent to zirconia and can be provided with new characteristics by compositing an appropriate second phase to the partially stabilized zirconia phase, more extended application uses are possible. For example, Japanese Patent Laid-Open No. 275977/1992 discloses a technique capable of increasing the flexural strength by a factor of two or more by incorporation of 20% by weight of alumina to zirconia. Further, Japanese Patent Laid-Open 221358/1997 discloses a technique for enabling electric spark discharge machining by incorporating electroconductive particles.

However, although improvement for various characteristics and provision of new characteristics are possible for the zirconia ceramic type ceramic members as described above at the laboratory level, troubles are often caused in the stage of developing them into actual products. Particularly, in those parts concerning molds requiring sharp edges (punches or dies), even ceramics of excellent flexural strength or hardness can not be used as parts for molds if edge portions are chipped, because they cause errors in the dimensional accuracy of products or form burrs, warps or flaws (marks) to works.

For example, lead frames used for the mounting of substrates of integrated circuit chips such as IC or LSI generally have shapes in which a plurality of leads corresponding to chip terminals of integrated circuits are arranged in complicated manners. While such lead frames were manufactured by chemical etching of metal plate blanks, an efficient manufacturing method by using punching has been adopted mainly in recent years along with a remarkable progress in mechanical working techniques. However, as can be seen from the fact that the etching was used, punching patterns for lead frames are extremely fine and even slight dimensional error or occurrence of burrs or warps results in a problem that directly leads to defects fatal to electric circuit parts such as contact failure with integrated circuit chips to be mounted and short-circuits. Accordingly, upon punching lead frames, higher dimensional accuracy is required for punched openings or finishing accuracy than that for other punched parts. Then, particularly accurate and sharp edge finishing are demanded for mold parts used for punching of such lead frames, particularly, for the edge of a top end surface of a punch that shears a metal blank plate between the edge and the inner edge of a die hole in a punching die, since even slight chipping or disturbance gives a direct effect on the accuracy of forming the punched openings.

In the case of a ceramic member requiring a sharp edge such as the punch or the die for use in the mold as described above, it is necessary to finally apply edge finishing by accurate grinding. However, in a case of existing zirconia series ceramics, there is a problem that such edge grinding tends to cause chipping at the edge portion. Therefore, a method of sacrificing the sharpness at the edge portion to some extent has been adopted for avoiding the occurrence of large chipping but this can not attain favorable working accuracy. However, if sharp edge finishing is performed excessively, chipping becomes significant making it sometimes impossible for the manufacture of products.

SUMMARY OF THE INVENTION

An object of the present invention is to provide an edged ceramic member and a manufacturing method thereof capable of effectively suppressing. the occurrence of chipping and, as a result, finishing the edge portion to such a sharpness as can not be attained so far and, thus, capable of remarkably improving the accuracy of working such as punching by using the same, as well as a punch for manufacturing lead frames capable of punching the lead frames at an extremely high accuracy and a method of manufacturing lead frames by using the ceramic member described above.

For achieving the foregoing object, the edged ceramic member according to the present invention is characterized by comprising a zirconia-containing ceramic material containing 20% by volume or more of a zirconia series ceramic phase mainly composed of a zirconium oxide, in which the zirconia-containing ceramic material satisfies:

$$KC/(d^A) \geq 5 \qquad (1)$$

by using an exponential value A set within a range from −0.41 to −0.37, d being an average grain size (unit: $\mu$m) and KC being a fracture toughness value (unit: MPa·m$^{1/2}$) thereof, and one or more of edged portions each present in the form of a ridge at an intersection between two edge forming surface are formed to the outer surface of the member, and at least one of the edge portions is formed as a sharp edge portion having a width for the edge top end of 0.15 mm or less present on a cross section taken along an arbitrary plane in perpendicular to the direction of the ridge.

In the present invention, the average grain size d of the zirconia-containing ceramic material means a value obtained by mirror-finishing the surface of a material by surface grinding and lapping, thermally etching the same in a nitrogen atmosphere under a normal pressure at 1300° C. conducing SEM observation (magnification: 5000×), and determining on an observed image as explained below. That is, crystal grains appearing on an observed image are approximated as a circles and the diameter distribution of them is determined and, further, a crystal grain size distribution is determined while approximating them as spheres by applying the Schwarts-Saltykov method (assuming the range for the grain size group as 0.1 $\mu$m), and the central value for the grain size group at which the cumulative frequency from the side of the smaller grain size reaches 50% is defined as the average grain size d. Further, the fracture toughness value means a value measured by the SEPB method in accordance with JIS:R1607.

Since chipping tends to be formed in the zirconia-containing ceramics as described above, it has been considered impossible to form a sharp edge portion with a top end width for the edge of 0.15 mm or less by usual grinding. However, as a result of an earnest study by the present inventor, it has been unexpectedly found that occurrence of chipping can be prevented extremely effectively even when the sharp edge as described above is formed and the present invention has been accomplished. That is, in the edged ceramic member of the invention, an edged ceramic member with excellent chipping resistance can be obtained when the zirconia series ceramic phase of the composition described above is contained and when the value B defined by:

$$KC/(d^A) = B \qquad (2)$$

is 5 or more with the exponential value A being defined within a range from −0.41 to −0.37.

As a result, the accuracy for punching or the like by using the member can be improved remarkably.

When the exponential value A is out of the range from −0.41 to −0.37, the value B according to the formula (2) no more indicates the difficulty or easiness for the occurrence of chipping of the zirconia-containing ceramic material and it loses a meaning as an index representing the chipping resistance. Further, it is essential that the value B is 5 or more, and a greater value is more advantageous in view of ensuring the chipping resistance. However, since it is difficult to set the crystal grain size in the zirconia series ceramic phase to 0.1 $\mu$m or less owing to the requirement in view of the manufacturing method (particularly, preparation of starting powder) and, correspondingly, the value B is often up to about 5. However, this does not define the upper limit in the invention. For improving the chipping resistance, it is desirable that the value B is 6 or more, preferably, 6.5 or more. As a result, as the value B increases, it is possible to finish the edge portion more sharply and, for example, it is preferred that the top end width for the edge is, for example, less than 0.1 mm and, more preferably, less than 0.07 mm as a more desired value.

In the sharp edge portion, since chipping giving an effect, for example, on the accuracy of punching or the like is no longer formed as a result, it is possible to make the maximum height Rmax to 70 $\mu$m or less for the surface roughness at the edge chip measured in the direction of the ridge. The maximum height Rmax means that chipping is suppressed more as it is smaller. In this case, Rmax can be decreased further as the value B is larger and, for example, it is possible to provide the value Rmax of preferably 50 $\mu$m or less, more preferably, 30 $\mu$m or less.

It is known that $ZrO_2$ and $HfO_2$ as the main component of the zirconia series ceramic phase cause transformation between each of three kinds of phases of different crystal structures depending on the change of temperature and, specifically, they form a monoclinic system phase in a lower temperature region including room temperature, a tetragonal system phase in a higher temperature region and a cubic system phase in a further higher temperature region. When the entire zirconia series ceramic phase comprises at least one of $ZrO_2$ and $HfO_2$, it is considered that almost of them form the monoclinic system phase. However, it is known that transformation temperature between the monoclinic system phase and the tetragonal system phase is lowered and the tetragonal system phase can be stabilized in a temperature region near the room temperature by including in solid-solution an alkaline earth metal oxide or a rare earth metals oxide (for example, calcia (CaO) or ittria ($Y_2O_3$)) by a predetermined amount or more as a stabilizing ingredient in $ZrO_2$ and $HfO_2$, In this case, it is known that the phase transformation from the tetragonal system phase to the monoclinic phase system is based on a so-called martensitic transformation mechanism or a similar phase transformation mechanism and, when external stress is applied, the transformation temperature rises and the tetragonal system phase causes a stress-induced transformation and the distortion energy given by the stress is consumed as the driving force for the transformation, so that the exerted stress is moderated. Accordingly, in a ceramic structure in which zirconia series ceramic phase particles containing such a tetragonal system phase are dispersed for instance, when chipping tends to occur during mechanical grinding for forming the sharp edge portion and if the zirconia type ceramic phase particles are present near the top end of a crack, the tetragonal system phase is transformed into the monoclinic system phase by the stress concentrated to the top end of the crack. This relaxes the stress localized to the top end of the crack to hinder or moderate the propagation of the crack.

It is considered that the fracture energy exerts exclusively in a direction of enlarging the crack by the elastic energy in other ceramic materials showing no stress relaxation by transformation, whereas it is considered for the zirconia-containing ceramic that volumic expansion in the transformation region formed to the top end of the crack exerts a compressive stress to a wake region adjacent the opening of the crack, which acts in the direction of closing the crack to suppress the preparation of the crack. Thus, distortion energy accumulation mechanism along with propagation of crack is greatly different between the zirconia-containing ceramics and other ceramics. It should be noted that the relation (1) described previously is effective only for the zirconia-containing ceramic material containing 20% by weight or more of the zirconia series ceramic phase and it can not be applied to other ceramics, for example, silicon nitride type ceramics in which the structure is formed of acicular crystal grains, ceramics with addition of SiC whiskers, glass ceramics in which a great amount of a glass ingredient phase is formed between individual crystal grains and polar ceramics such as refractories. While the reason can not be explained clearly, it may be estimated that the difference of the accumulation mechanism of the distortion energy described above between the zirconia series material and other ceramic material is concerned.

If the content of the zirconia series ceramic phase is less than 20% by volume, sufficient chipping resistance cannot be ensured. The content for the content of the zirconia series ceramic phase is desirably from 60 to 98.5% by volume. If the content of the zirconia series ceramic phase exceeds 98.5% by weight, sufficient density for a sintering product can not sometimes be obtained because of insufficiency of a sintering aid ingredient.

Further, the relative density of the zirconia-containing ceramic material is preferably 98% or more. If the relative density is less than 98%, sufficient flexural strength cannot be obtained, making it sometimes impossible to be used, even if the value B is 5 or more, depending on the purpose of use of the edged ceramic member (for example, a punch or a die for use in mold undergoing a strong impact and requiring an extremely sharp edge portion such as in lead frame punching to be described later). Further, if the content of the zirconia series ceramic phase is less than 20% by volume, the relative density can not sometimes be increased to 90% or more even if a pressure sintering method such as a hot pressing or HIP is adopted, and it can be said desirable to adjust the content of the zirconia series ceramic phase within the range described above also in view of securing the relative density.

In the edged ceramic member according to the invention, the zirconia series ceramic phase is mainly composed of the zirconium oxide but this is not restrictive and "main ingredient" or "mainly composed of" means 50% by weight or more in the present specification.

Further, as the stabilizing ingredient for the zirconia series ceramic phase, it is desirable to contain one or more of Ca, Y, Ce and Mg within a range from 1.4 to 4 mol % in total as the content in the zirconia series ceramic phase being expressed as the value for an oxide, that is, CaO for Ca, $Y_2O_3$ for Y, $CeO_2$ for Ce and MgO for Mg, respectively. If the content of the stabilizing ingredient is less than 1.4 mol %, since the content ratio of the monoclinic system phase increases, the content ratio of the tetragonal system phase is lowered relatively failing to obtain a sufficient stress relaxation effect described above, so that the chipping resistance upon forming the sharp edge portion with the conditions described above may sometimes be insufficient. On the other hand, if the content of the stabilizing ingredient exceeds 4 mol %, the content ratio of the cubic system phase is increased and the chipping resistance may also be sometimes insufficient. The content of the stabilizing ingredient is preferably from 1.5 to 4 mol % and, more preferably, from 2 to 4 mol %.

As the stabilizing ingredient for the tetragonal system phase, specifically, $Y_2O_3$ is used suitably in the invention since the strength of the resultant ceramic material is higher and the cost is relatively inexpensive compared with the case of using other stabilizing ingredients. On the other hand, CaO and MgO can also be used suitably in the invention since the strength of the obtained ceramic material is relatively higher although not so remarkable as in the case of using $Y_2O_3$ and they are less expensive further compared with $Y_2O_3$. $Y_2O_3$, CaO and MgO can be used each alone or used in combination of two or more of them.

Then, since $ZrO_2$ and $HfO_2$ as the main ingredient of the ceramic particle body are similar in chemical and physical properties, they may be used either alone or used in combination of them. However, since $ZrO_2$ is less expensive compared with $HfO_2$, it can be said that the ceramic particle product is desirably constituted with $ZrO_2$ as the main ingredient. While usually available $ZrO_2$ raw materials at an ordinary purity often contain a trace amount of $HfO_2$, there is scarce requirement of positively removing $HfO_2$ contained therein with the reasons described above in a case of using such starting materials.

Further, in the zirconia series ceramic phase, it is desirable that the ratio CW/TW between the existent weight CW for the cubic system phase and the existent weight TW for the tetragonal system phase is less than 1. The tetragonal system phase is tended to be formed when the content of the stabilizing ingredient is increased to lower the transformation point relative to the tetragonal system phase or when the sintering temperature exceeds 1600° C. and it has a property of tending to make crystal grains coarser during sintering compared with the monoclinic system phase or the tetragonal system phase. Then, grown crystal grains of the cubic system phase are easily detached since the boundary bonding force with respect to other crystal grains is small and, if the amount of the cubic system phase increases till the ratio exceeds 1, the amount of the grown crystal grains formed is also increased. They lead to degradation of the chipping resistance upon forming the sharp edge portion with the conditions described above. Therefore, the ratio CW/TW is preferably less than 1 and, desirably, less than 0.5 and, more desirably, less than 0.1.

Information regarding the existent ratio for the tetragonal system phase and the cubic system phase is obtained as below. For example, a portion of the ceramic material is mirror finished and X-ray diffractometry is conducted on the polished surface by a diffractometer method. In this case, in the obtained diffraction pattern, since (111) strength peak positions as the main diffraction peaks for the tetragonal system phase and the cubic system phase appear adjacent with each other, the existent amount for the monoclinic system phase is at first determined based on the ratio of the total intensity Im for (111) and (11-1) of the monoclinic system phase and the sum of It+Ic for the (111) intensity of the tetragonal system phase and the cubic system phase. Then, the sintered product is mechanically pulverized and X-ray diffractometry is conducted again to determine the (111) intensity I'm and I'c of the monoclinic system phase and the tetragonal system phase. In this case, since it is considered that the tetragonal system phase in the sintering product transforms into the monoclinic system phase by the mechanical stress accompanied by the pulverization, the existent amount for the cubic system phase can be determined based on I'c/(I'm+I'c). It is desirable that the thus obtained value I'c/(I'm+I'c) is 0.5 or less, preferably, 0.1 or less for improving the chipping resistance upon forming the sharp edge portion with the conditions as described above.

Then, the zirconia-containing ceramic material may be a composite ceramic material in which the matrix ceramic phase constituting a remaining portion of the zirconia series ceramic phase mainly comprises an electroconductive inorganic compound having at least one of Ti, Zr, Nb, Ta and W as the metal cationic ingredient and/or alumina. For example, when alumina is contained in the matrix ceramic phase, the flexural strength of the zirconia-containing ceramic material can be improved outstandingly, and the durability of the edged ceramic member when used for punching mold can be improved remarkably. In this case, it is preferred that the content of the zirconia series ceramic phase is from 20 to 80% by volume and the content of the alumina type phase mainly comprising alumina as the main ingredient is from 20 to 80% by volume in order to improve the chipping resistance upon forming the sharp edge portion.

On the other hand, the zirconia-containing ceramic material can be provided with electroconductivity and thus the ceramic material can. be applied with spark discharge machining such as wire cutting, by incorporating the electroconductive inorganic compound into the matrix ceramic phase. The electroconductive inorganic compound may be at least one of metal nitrides, metal carbides, metal borides, metal carbonitrides and tungsten carbide having at least one of Ti, Zr, Nb and Ta as the metal cationic ingredient and, specifically, it can include, for example, titanium nitride, titanium carbide, titanium boride, tungsten carbide, zirconium nitride, titanium carbonitride and niobium carbide. In this case, for improving also the chipping resistance upon forming the sharp edge while ensuring the electroconductivity for enabling spark discharge machining, it is preferred that the content of the zirconia series ceramic phase is from 20 to 80% by volume and the content of the electroconductive inorganic compound phase is from 20 to 80% by volume.

By the way, the edged ceramic member as described above can be used as a ceramic working tool for shearing, cutting and bending or deep draw using the sharp edge portion as a site of applying the working force. Since the edged ceramic member of the invention is formed with a sharp edge portion with less chipping-induced defects, working at high accuracy is possible by utilizing the same as a site of applying the working force.

Such a ceramic working tool is particularly effective when used as a punching tool for a lead frame required for punching a fine pattern at a high accuracy. Specifically, a lead frame can be manufactured by using the edged ceramic member of the invention as described below. That is, a metal plate blank is placed between the punch constituted as the edged ceramic member described above and a punching die having a die hole, and advancing the punch in this state relatively into the die hole along an axial direction thereby shearing the metal plate blank between the edge portion of the punch and the inner circumferential edge portion of the die hole. In this case, punched opening corresponding to the shape at the top end surface of the punch is formed to the metal plate blank.

Further, when the edged ceramic member described above is applied to a punch for manufacturing a lead frame, the following constitution can be exemplified as a preferred embodiment for preventing occurrence of chipping upon forming a sharp edge portion. That is, the punch for manufacturing the lead frame is formed with an edge portion at an intersection between the top end surface of the punch and the outer circumferential surface of the punch, the top end portion of the punch at least including the edge portion thereof comprises a zirconia-containing ceramic material having a relative density of 98% or more and satisfying:

$$KC/(d^A) \geq 5$$

by using an exponential value A set within a range from −0.41 to −0.37, d being an average grain size (unit: μm) and KC being a fracture toughness value (unit: MPa·m$^{1/2}$), and the volumic content of the zirconia series ceramic phase containing 50% by weight or more of a zirconium oxide is 60 to 98.5% by volume, and the edge portion is formed as a sharp edge portion having a top end width for the edge of 0.15 mm or less present on a cross section taken along an arbitrary plane in perpendicular to the direction of the ridge, and a maximum height Rmax for the surface roughness on the top end of the edge of 50 μm or less as measured in the direction of the ridge.

Then, the first method of manufacturing an edged ceramic member according to the invention is characterized by applying grinding to the outer surface of a zirconia-containing ceramic material containing 20% by volume or more of a zirconia series ceramic phase mainly composed of a zirconium oxide and satisfying:

$$KC/(d^A) \geq 5$$

by using an exponential value A set within a range from −0.41 to −0.37, d being an average grain size (unit: μm) and KC being a fracture toughness value (unit: MPa·m$^{1/2}$), thereby forming a sharp edge portion present in the form of a ridge at an intersection between two edge forming surface having a top end width for the edge of 0.15 mm or less present on a cross section taken along an arbitrary plane perpendicular to the direction of the ridge and a maximum height Rmax of 50 μm or less as the surface roughness on the top end surface of the edge as measured in the direction of the ridge.

When the values for KC and d of the zirconia-containing ceramic material are adjusted so as to provide: B≡KC/(d$^A$) ≥5, even when a sharp edge portion with the top end width for the edge of 0.15 mm or less is formed by grinding, the maximum height Rmax for the surface roughness on the top end surface of the edge can be reduced to 50 μm or less. That is, a sharp edge portion with less chipping can be formed.

A second method of manufacturing an edged ceramic member according to the invention comprises a method of manufacturing an edged ceramic member by applying grinding to the outer surface of a zirconia-containing ceramic material containing 20% by volume or more of a zirconia series ceramic phase mainly composed of a zirconium oxide thereby forming one or more of edge portions present in the form of a ridge at an intersection between two edge forming surfaces characterized by, measuring an average grin size d (unit: μm) and a fracture toughness value KC (unit: MPa·m$^{1/2}$) of the zirconia-containing ceramic material before grinding, and then applying grinding only to the zirconia-containing ceramic material having d and KC satisfying:

$$KC/(d^A) \geq 5$$

by using an exponential value A set within a range from −0.41 to −0.37.

By measuring KC and d for the zirconia-containing ceramic material and examining whether B≡KC/(d$^A$)≥5 is satisfied or not based on the measuring values before grinding, it can be judged that whether the material tends to cause pitching or not before conducting grinding. As a result, since it can be determined whether the material is suitable to the formation of the sharp edge portion or not even without conducting actual grinding, wasteful loss of applying working to a not suitable material can be saved, for example, in a mass production, and it greatly contributes to the shortening of the period of time for the development of a material or reducing the development cost for a material in the course of the developing stage.

Further, the zirconia-containing ceramic material can be produced, for example, as described below. At first, a starting zirconia material, a starting material containing second phase particles to form a matrix ceramic phase and a solvent (water or an organic solvent less reactive with the starting material such as ethanol) are at first mixed to prepare a slurry. There is no particular restriction on the mixing method and, for example, ball mill mixing, trommel mixing or attrition mill mixing can be adopted. Further, various kinds of additives, for example, a dispersant or a decoagulation agent such as ammonium polycarboxylate, a viscous binder such as polyvinyl alcohol or polyacrylate ester type emulsion or a plasticizer such as stearic acid, microwax or paraffin may optionally be added in this case. Further, an antistatic agent, a defoamer and the like can also be added simultaneously.

The thus obtained slurry is dried and pelleted by an appropriate method into a dry powdery pellet. As the dry pelleting method, a spray drying method, a freeze drying method a vacuum drying method and the like can be adopted. Among them, when at least one of metal nitrides, metal carbides, metal boride, metal carbonitrides and tungsten carbide comprising one or more of Ti, Zr, Nb and Ta as the metal cationic ingredient are used as the second phase grains in the spray drying method, the inlet temperature for a hot blow used for the spray drying is preferably set to 200° C. or lower, more preferably, to 170° C. or lower for preventing or suppressing oxidation of the starting material.

The dry powdery pellet obtained in this manner is molded into a desired shape of a ceramic member. As the molding method, mold pressing, cold isostatic pressing, slurry casting mold (slip casting), extrusion molding and injection molding can be adopted. Further, it is also possible to combine several of the methods described above such as applying a mold pressing at a low pressure followed by cold isostatic pressing.

The thus obtained molding product is sintered by an appropriate method into a sintering product. As a sintering method, an atmospheric pressure sintering method, a hot pressing method or a hot isostatic pressing (HIP) method can be adopted. Further, it is also possible to combine several of the methods described above such as sintering by the atmospheric pressure sintering followed by applying the hot isostatic pressing. As the sintering atmosphere, an oxidative atmosphere such as a surrounding air atmosphere is preferably used in a case of not containing the second phase particles or in a case of using alumina as the second phase particles, and an inert atmosphere (including vacuum atmosphere) or a reducing atmosphere such as a hydrogen atmosphere is desirably used in a case of using at least one of metal nitrides, metal carbides, metal borides, metal carbonitrides and tungsten carbide having one or more of Ti, Zr, Nb and Ta as the metal cationic ingredient. The sintering temperature can be set within a range from 1300 to 1900° C., preferably, from 1400 to 1600° C. Further, when the molding product contains organic additives (for example, dispersant, decoagulating agent, viscous binder, lubricant, antistatic agent or defoamer), it is preferred to apply calcination at 400 to 600° C. prior to the sintering within the temperature range described above, so that the organic additive ingredients are previously decomposed, removed or reduced by evaporation.

To the outer surface of the thus obtained ceramic sintered body, grinding is applied for forming a sharp edge portion. In this case, the sharp edge portion having the top end width for the edge described above is finished by grinding, for example, for both of the two edge forming surfaces with a grinding stone. For example, in a case of using a rotational grinding wheel, a diamond grinding wheel of #200 to 800 according to JIS B 4130 is preferably used, and the direction of the rotation is preferably aligned with the direction of the ridge of the edge portion to be formed and the feeding direction of a work (sintered ceramic body) for further suppressing the occurrence of chipping. Further, it is preferred that the cutting amount per 1 pass is from 0.5 to 5 $\mu$m and a work feed rate is 1 to 20 m/min based on the rotational circumferential speed of 1000 to 6000 m/min.

Figure 1:
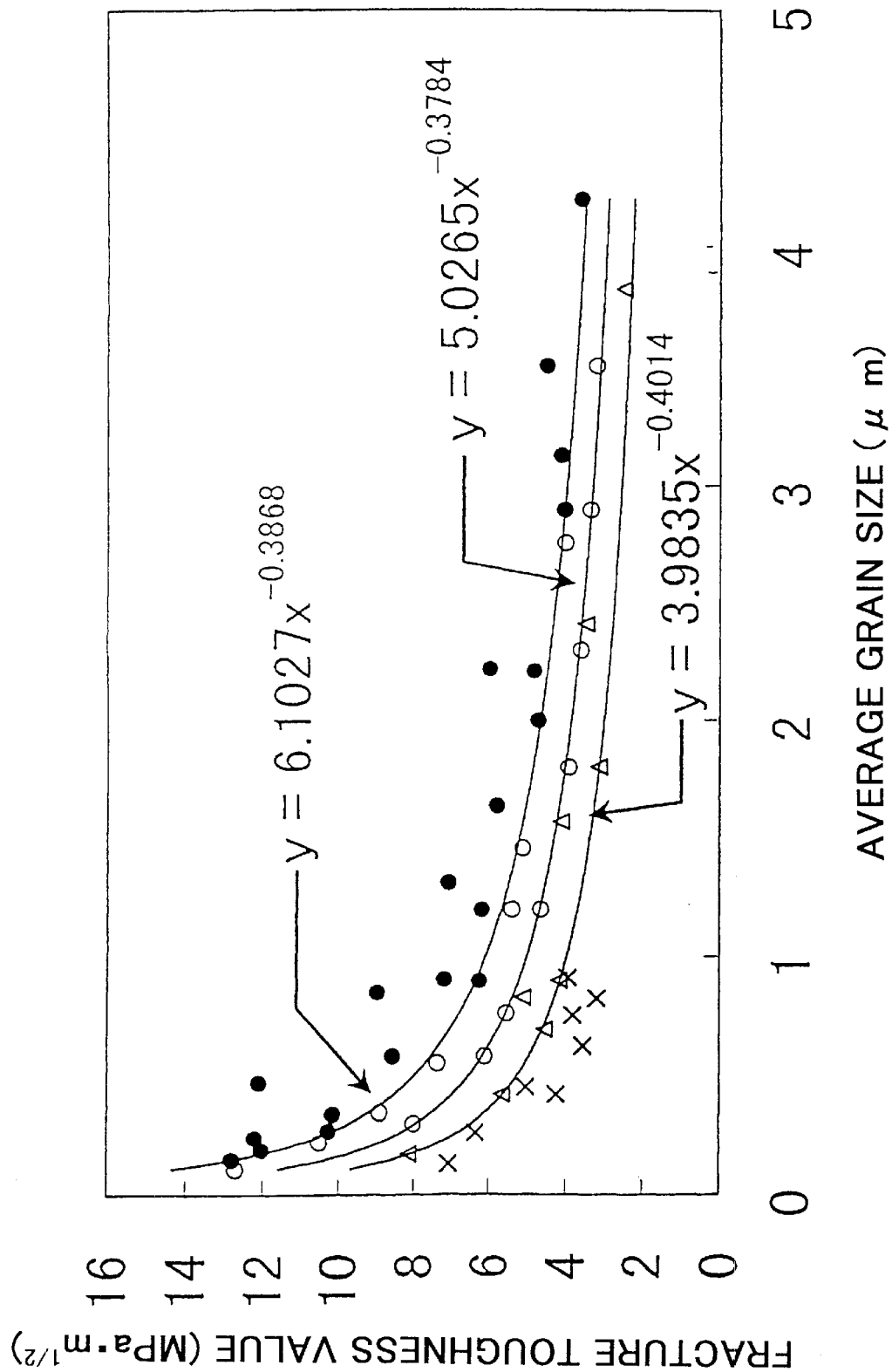
FIG. 1 is a graph for each of the data for the experimental example formed by plotting the measured values of fracture toughness values relative to the measured value for the average grain size.

Reference signs used in the drawings identify items as follows:

| 1, 60 | lead frame |
| 4, 56 | punch (edged ceramic member) |
| E | sharp edge portion |
| 6, 54 | punching die (edged ceramic member) |
| 7, 56a | die hole |
| 20 | cutlery (edged ceramic member) |
| 70 | deep drawing punch (edged ceramic member) |

DETAILED DESCRIPTION OF PREFERRED EMBODIMENTS

Embodiments of the invention will now be described, by way of example only, with reference to the accompanying drawings.

Figure 2:
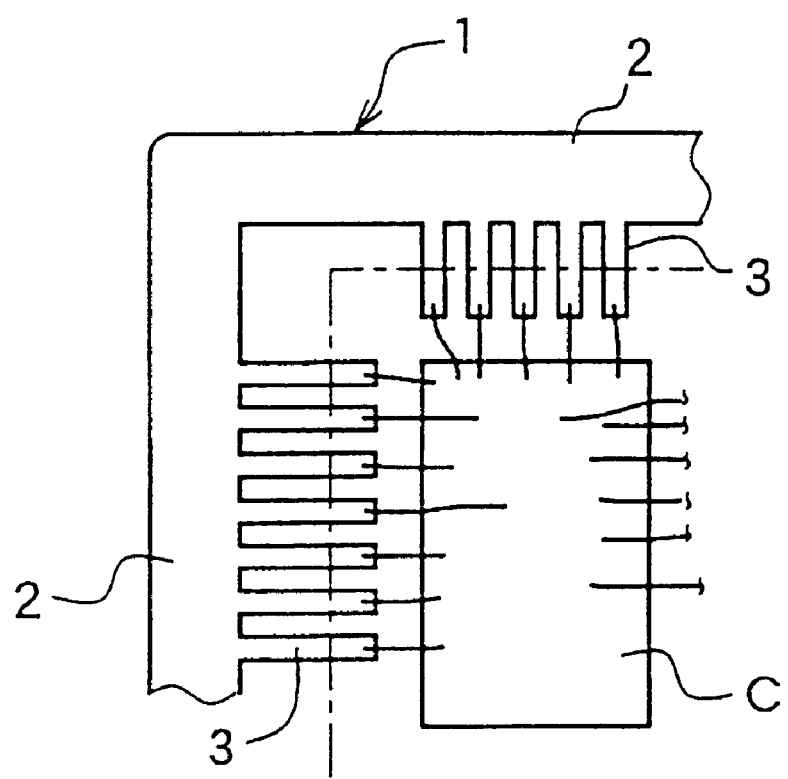
FIG. 2 is a plan view schematically showing a lead frame.
Figure 3:
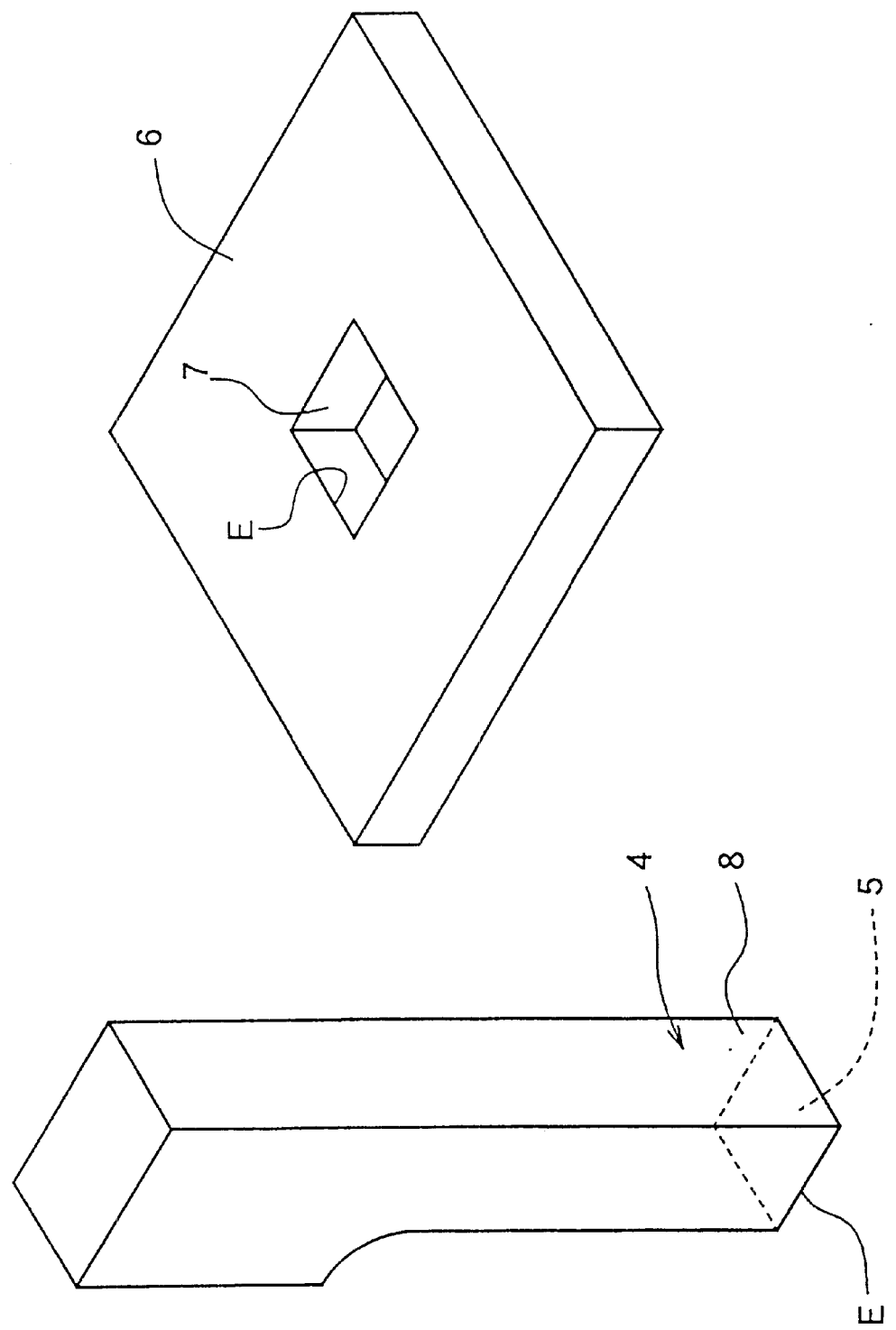
FIG. 3 is a perspective view showing an example of a punch and a punching die.

Firstly, a mold used for lead frames as an example of an edged member according to the present invention will be explained. As shown in FIG. 2, a lead frame 1 comprises a frame 2 and lead 3. In FIG. 2, C shows an IC substrate. FIG. 2 only shows an example of lead frames and various shapes are possible for lead frames to be manufactured by using a mold as the ceramic member of the invention. FIG. 3 shows an example of a ceramic mold according to the invention. As shown in FIG. 3, the mold includes a punching die 6 and a punch 4 entering and exiting to and from a die hole 7 therein. A punch 4 has a top end surface 5 of the punch corresponding to an opening of a metal plate member to be punched. While this is referred to as a "metal mold", it is actually constituted with a zirconia-containing ceramic material and is not made of metal. Then, a sharp edge portion E is formed at an intersection between an outer circumferential surface 8 of the punch 4 and a top end surface 5 of the punch. However, only the top end of the punch including the sharp edge portion E may be constituted with a zirconia-containing ceramic and the remaining portion may be constituted with a metal material or other ceramic material. The metal plate blank is, for example, made of Cu, Cu alloy or Fe—Ni alloy such as Fe-42 wt % Ni alloy and a thickness is about 0.1 to 0.9 mm.

Figure 6:
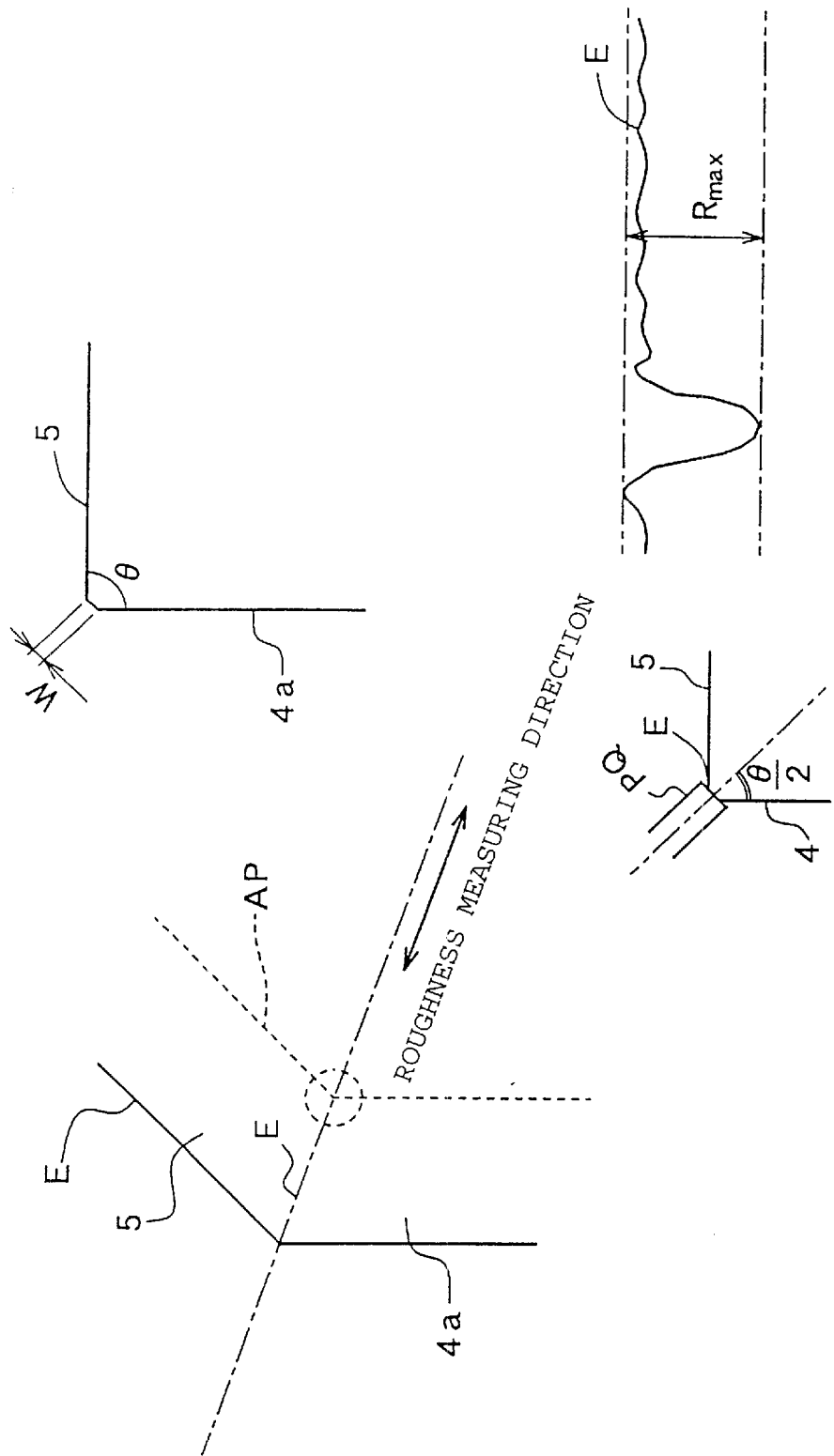
FIG. 6 is an explanatory view showing an example of forming an edge portion at the top end surface of a punch into a sharp edge portion.

The zirconia-containing ceramic material described above comprises a material having a relative density of 98% or more satisfying:

$$KC/(d^A) \geqq 5$$

by using an exponential value A set within a range from −0.41 to −0.37, d being an average grain size (unit: $\mu$m) and KC being a fracture toughness value (unit: MPA·m$^{1/2}$). The volumic content of the zirconia series ceramic phase containing 50% by weight or more of a zirconium oxide is defined as 60 to 98.5% by volume. Then, as shown in FIG. 6, a sharp edge portion E has a top end width w for the edge of 0.15 mm or less present on a cross section taken along an arbitrary plane AP in perpendicular to the direction and a maximum height Rmax of 50 $\mu$m or less for the surface roughness on the top end of the edge measured by moving a roughness measuring probe PQ along the direction of the ridge.

Figure 4:
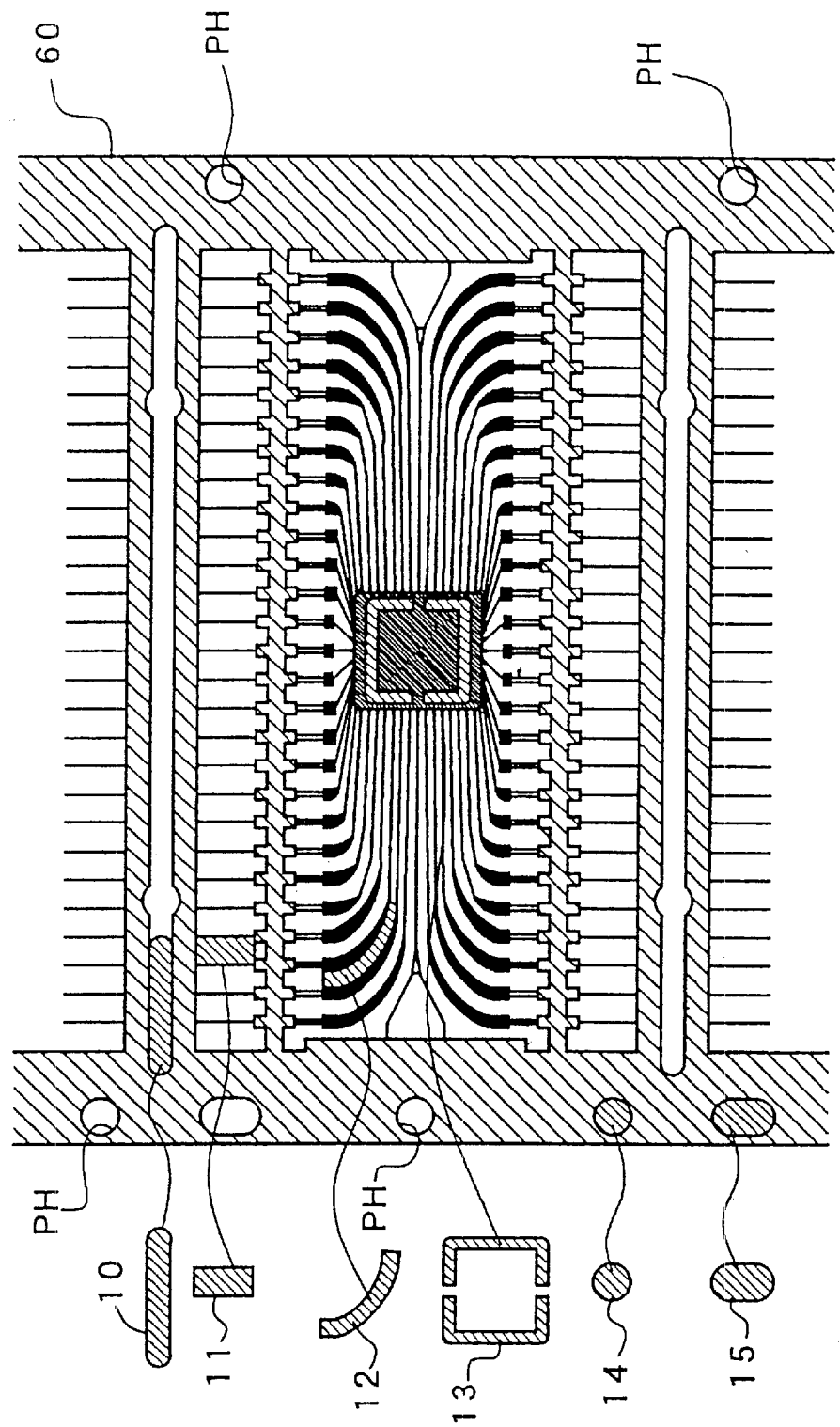
FIG. 4 is a plan view showing a concrete example of a lead frame and shapes of a punch top end for punching each of the portions of openings.

Since openings to be punched in the metal plate member have various shapes according to the design of lead frames, the top end surface 5 of the punch also has various shapes. For example, FIG. 4 is a plan view showing an example of a lead frame 60 actually punched. In the figure, blank portions indicate openings while coarsely hatched portions indicate metal portions. As described above, the openings are formed in various different shapes arranged finely and complicately depending on the places although in one identical lead frame. Since it is extremely difficult to punch such openings all at once, the openings are usually considered as several divisional elemental portions and a step of applying punching on every elements by using punches 10 to 15 having shapes for the top end surfaces corresponding to the respective elements is adopted.

Figure 5:
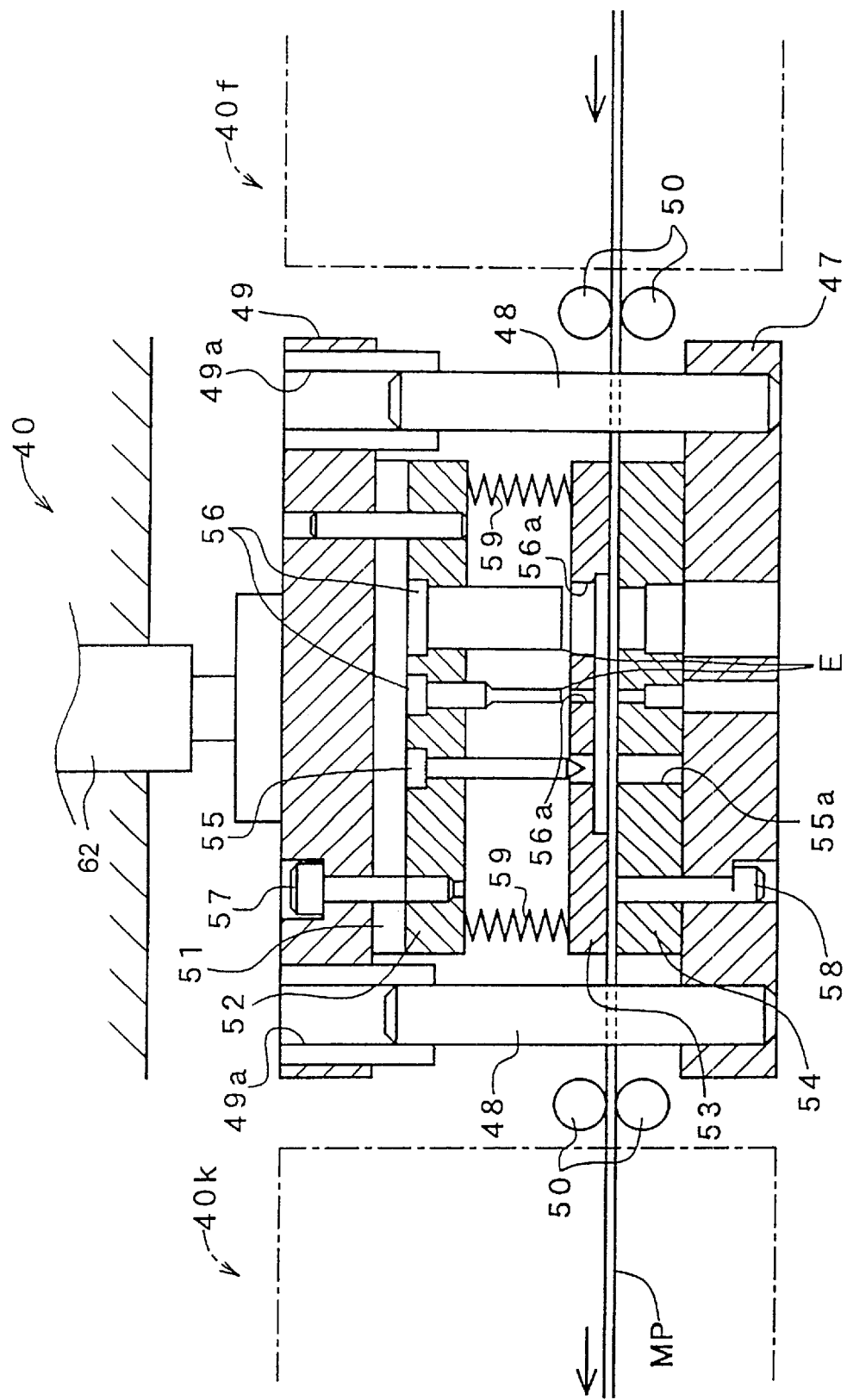
FIG. 5 is a side elevational cross sectional view showing an example of an apparatus for punching a metal plate member stepwise to form a lead frame.

Specifically, as shown in FIG. 5, while feeding a strip-shaped metal plate blank MP, for example, in a longitudinal direction by a transportation mechanism such as feed rolls 50, punching is applied successively by a plurality of punching devices 40f, 40 and 40k disposed along the conveying direction. A schematic structure is shown only with respect to the punching device 40 at the central portion. That is, in the punching device 40, basically, a metal plate blank MP is disposed between a punch 56 and a punching die 54 having a die hole 56a, and the punch 56 is advanced in the axial direction relatively into the die hole 56a by a cylinder 62 which is an approaching/operating unit thereby shearing the metal plate blank MP between the sharp edge portion E of the punch 56 and the inner circumferential edge of the die hole 56a, by which a punched opening corresponding to the shape for the top end surface of the punch is formed.

In this example, a punching die 54 is fixed on a lower base plate 47 by a bolt 58 as a clamping member, and guide pins 48 are disposed vertically in the manner of protruding from the upper surface of the lower base plate 47. Then, the punch 56 and a pilot pin 55 are attached by way of a punch plate 52 and a packing plate 51 by means of a bolt 57 as a clamping member to the lower surface of an upper base plate 49 sliding vertically along the guide pins 48 in guide holes 49a. Then, when the upper base plate 49 is driven vertically by the cylinder described above, the punch 56 and the pilot pin 55 are brought closer to/spaced apart from the punching die 54 for punching. The pilot pin 55, as shown in FIG. 4, intrudes passing through a pilot hole PH previously formed in the metal plate blank into a positioning hole 55a formed to the punching die 54 thereby playing a role of positioning the metal plate blank MP to the punch 56 and the punching die 54. Further, a stripper plate 53 for withdrawing the punch 56 from the metal plate blank MP after punching is attached by way of springs 59 to the punch plate 52.

When a material in which the matrix ceramic phase forming a remaining portion of the zirconia series ceramic phase is constituted with an electroconductive ceramic is used, for example, as the zirconia-containing ceramic material with the conditions described above, an outlined shape for the punch 4 shown in FIG. 3 (or punch shown in FIG. 5) can be cut out by spark discharge machining. Then, a sharp top end edge E can be formed by polishing the top end surface of the punch and the outer circumferential surface 8 of the punch with a diamond grinding wheel. By applying punching using such a sharp edge portion E, even fine openings in the lead frame 60 as shown in FIG. 4 can also be punched at a high accuracy.

In a case of manufacturing a lead frame, a punching die 6 can also be constituted as the edged ceramic member according to the invention with a circumferential edge of the opening for the die hole 7 being formed with a sharp edge portion E. On the other hand, since the edge forming accuracy for the punch has a greater effect on the punching accuracy, only the punch may be constituted as the edged ceramic member according to the invention and the punching die may be constituted with other material such as a superhard alloy.

Figure 7:
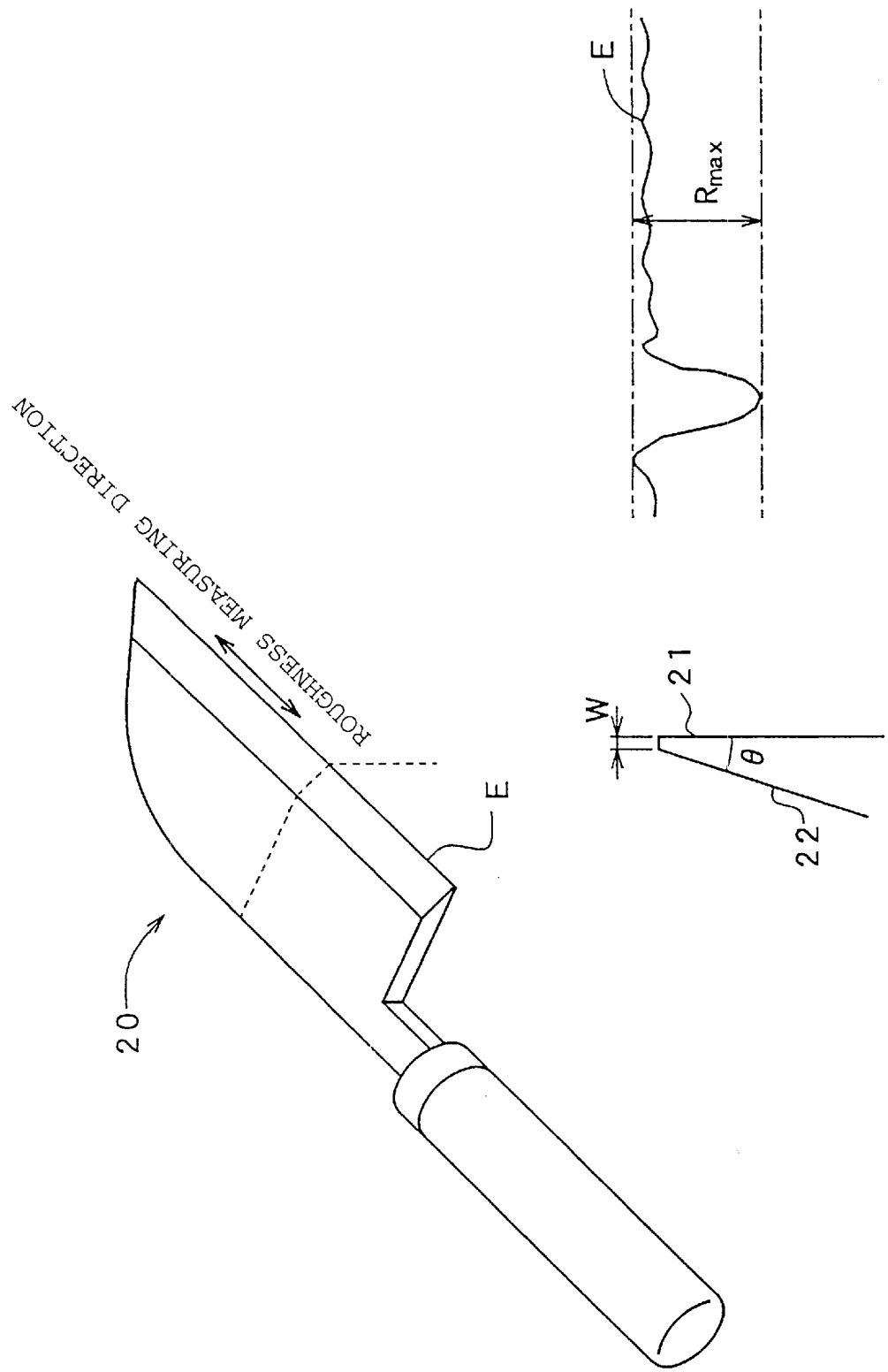
FIG. 7 is an explanatory view showing an example of forming a blade of a cutlery as a sharp edge portion.
Figure 9:
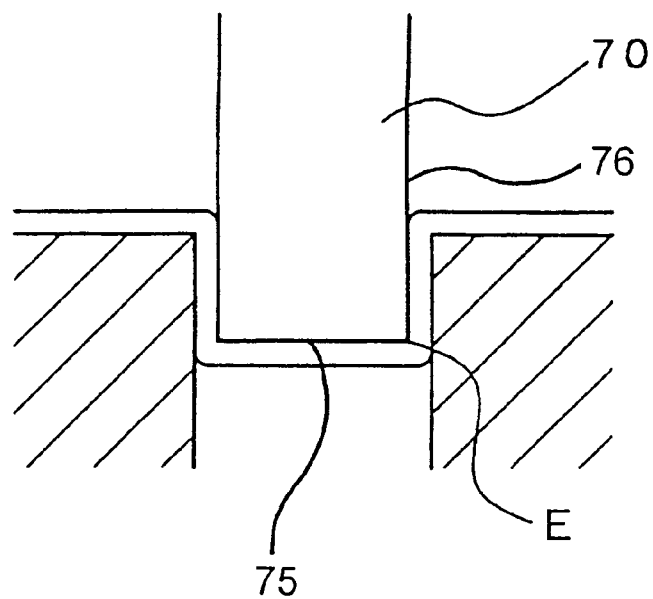
FIG. 9 is a schematic view showing an example of forming a deep drawing punch as an edged ceramic member of the invention.

Furthermore, the edged ceramic member according to the invention is not restricted to the punch or the punching die but is also applicable to a punch 70 for use in deep drawing as shown in FIG. 9. In this embodiment, an edge between top end surface 75 and an outer circumferential surface 76 of the punch is formed as a sharp edge portion E. Further, as shown in FIG. 7, an edge forming a blade of a ceramic cutlery 20 may be formed as a sharp edge portion E. Further, the edged ceramic member of the invention is also applicable to a member for bending working.

Figure 8:
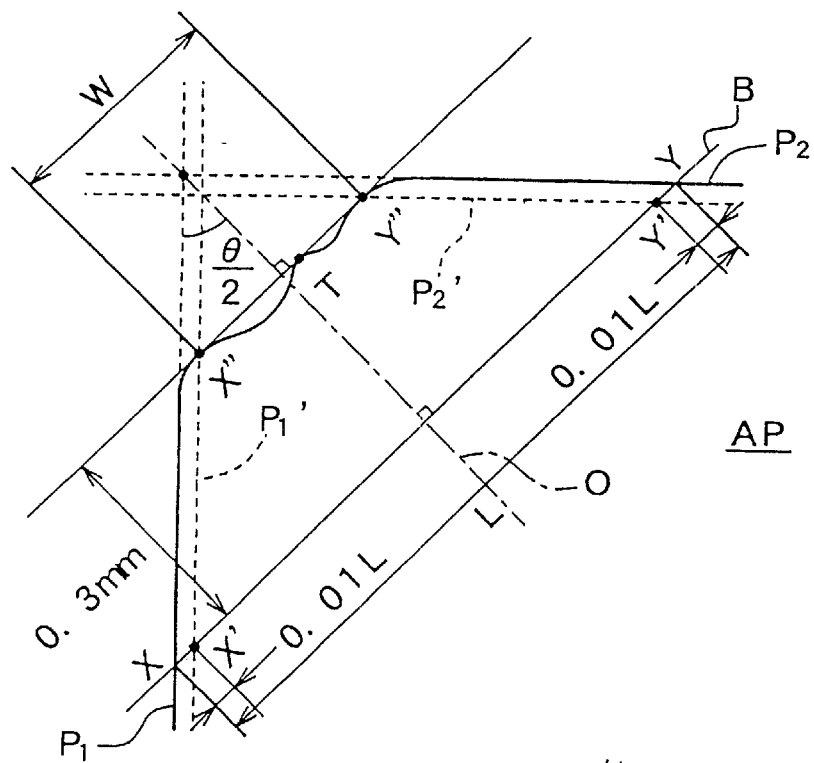
FIGS. 8(a) and 8(b) are explanatory views.
Figure 8:
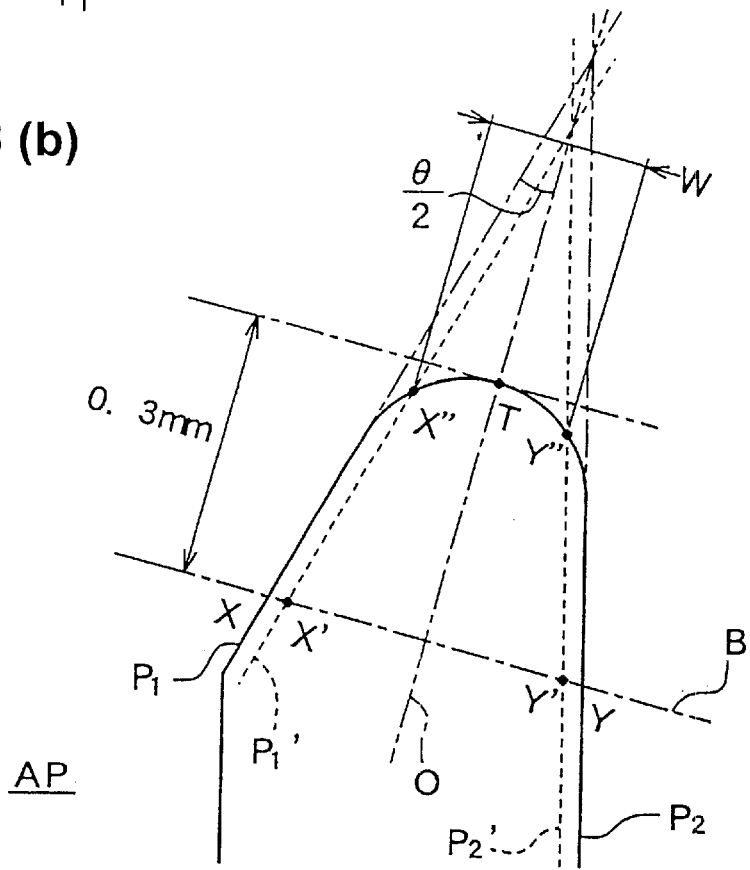

In the edged ceramic member according to the invention, the outer edge position for the top end width w of the edge may be indefinite depending on the cross sectional shape for the edge top end of the edge. In this case, the top end width w of the edge is determined as shown in FIG. 8. At first, a center line O is set at a position for bisecting an angle θ between two cut lines P1 and P2 representing edge forming surfaces on the plane AP (FIG. 6) (when undulation for the cutting lines P1 and P2 are relatively large, an integration center line averaging the surface roughness is adopted). Then, a reference line B in perpendicular to the center line O is set along the center line O at a position 0.3 mm from the top end position T of the edge in the direction of the center line O. Further, assuming each of intersections between the reference line and the cutting lines P1 and P2 as X and Y, and assuming the distance X-Y as L, points X' and Y' are set each at a position of 0.01L (1% position for the length L) inward from X and Y respectively. Then, a line P1' passing through X' and in parallel with P1 and a line P2' passing through Y' and in parallel with P2 are drawn, intersections between them and the top end surface of the edge are assumed as X" and Y", and the distance between X"–Y" in the direction of the reference line B is defined as the top end width w for the edge. Examples of determining the top end width w of the edge are shown in a case where the edge forming surfaces are substantially in perpendicular to each other in FIG. 8(a) as in the punch 4 in FIG. 3 and in a case where the edge forming surfaces form an acute angle in FIG. 8(b) as in a cutlery shown in FIG. 7.

As a commercially available partially stabilized zirconia starting material, those containing 2 mol %, 3 mol % and 4 mol % of $Y_2O_3$ (KZ series: Kyoritsu Yogyo Genryo Co.) were provided. After calcinating them at each of temperatures of 1200° C., 1300° C. and 1400° C., they were classified into six stages of 0.3 μm or less, 1.4 to 0.7 μm, 0.7 to 1.0 μm, 1.1 to 1.5 μm, 1.6 to 2.0 μm and 2 μm or more. The zirconia starting material after the classification, and a particle starting material for the second phase comprising at least one of starting alumina material (AKP-20, AKP-50, manufactured by Sumitomo Chemical Industry Co.), or at least one of metal nitrides, metal carbides, metal borides, metal carbonitrides and tungsten carbide having one or more of Ti, Zr, Nb and Ta as the metal cationic ingredient, (electroconductive inorganic compound phase) were blended so as to form compositions shown in Table 1, they were molded by mold pressing and then sintered under various conditions by hot isostatic pressing (HIP) or hot pressing. In the former, primary sintering was conducted in 2 atm nitrogen atmosphere at each of temperatures from 1400 to 1700° C. for 2 hours and then an HIP treatment was conducted in an argon atmosphere at 1800 atm, at each of temperature of 1450 to 1900° C. for 2.5 hours. Further, the latter was conducted in an argon atmosphere under a pressure of 200 kg/cm² at each of temperatures of 1700 to 1900° C. for 3 hours (preliminary sintering was not conducted).

The average grin size for each of the thus obtained sintering products was measured by mirror-finishing the surface of the material by surface grinding and lapping, then conducting thermal etching in a nitrogen atmosphere under an atmospheric pressure at 1300° C., followed by SEM observation (magnification factor: 5000x) and then by using the Schwarts-Saltikov method by the method described above on the observed images. Further, fracture toughness value was measured by the SEPB method according to JIS:R1607. Further, since the zirconia series phase, the alumina type phase and the conductive inorganic compound phase cause difference in the brightness on the SEM images, the volumic content ratio for each of them was determined based on the area ratio by image analysis.

The sintering predicted described above were fabricated into test pieces each of a cubic shape of 20×10×60 mm by grinding using a surface grinding machine (PFG-450DXA, manufactured by Okamoto Kosaku Kikai Seisakusho). The kind of the grinding wheels used and the grinding conditions are as shown below: mechanical grinding is applied by using a #400 diamond grinding wheel having 180 mm outer diameter and 10 mm thickness according to JIS B 4131 (SDC400-J100-BN-5.0 manufactured by Toyota Van Mops), at a circumferential speed of 1400 m/min and with a table feed rate of 5 m/min and a cutting depth per 1 pass of 5 $\mu$m in the edge forming direction.

Then, for each of the edge portions of the test pieces, a shape measurement for measuring the top end width w of the edge (numerical values for the chamfering width C and the radius of curvature R were also measured in this case), and a surface roughness measurement for the direction of the ridge were conducted. The shape measurement was conducted by using a shape measuring device (CONTRACER CPH-400, manufactured by Mitsutoyo Co.). Further, each of the edge portions was observed for the appearance by an optical microscope (magnification factor: 50x) and evaluated as defective (X) for those in which chippings having a width or depth of 0.1 mm or more were observed at one or more places, favorable (A) for those in which chippings of 0.05 mm to 0.1 mm were observed at one or more places, good (○) for those in which chippings of 0.02 mm to 0.05 mm were observed at one or more places and excellent (●) for those in which chippings of 0.02 mm or more were not observed at all.

Further, the existent ratio between the tetragonal system phase and the cubic system phase in each of the sintering product was determined as shown below. That is, a portion of the sintering product was mirror finished, and X-diffractiometry is conducted by a diffractometer method on the polished surface. At first, the weight ratio MW for the monoclinic system phase and the weight ratio TW+CW for the tetragonal system phase+cubic system phase were determined based on the ratio of the total intensity Im for (111) and (11-1) for the monoclinic system phase and the sum: It+Ic of (111) intensity for the tetragonal system phase and the cubic system phase. Then, the sintering product was mechanically pulverized and the X-ray diffractiometry was conducted again to determine I'm and I'c of (111) intensity for the monoclinic system phase and the tetragonal system phase. Assuming that the tetragonal system phase in the sintering product is entirely transformed into the monoclinic system phase by the mechanical stresses accompanied by pulverization, the weigh ratio CW for the tetragonal system phase is determined based on I'c/(I'm+I'c). Since TW+CW have been previously determined, when CW is subtracted therefrom, the weight ratio TW for the tetragonal system phase can be determined. The foregoing results are shown in Table 1–Table 6.

TABLE 1

| | Composition | | | | Sintering condition | |
|---|---|---|---|---|---|---|
| | *1 Zirconia | *2 Alumina | *3 Second phase ingredient | | Primary sintering tempera- | HIP sintering Tempera- |
| | vol % | vol % | Kind | Vol % | ture (° C.) | ture (° C.) |
| 1 | 20 | 0 | TiB$_2$ | 80 | 1900° C. hot press | |
| 2 | 25 | 20 | TaC | 55 | 1900° C. hot press | |
| 3 | 25 | 0 | ZrC | 75 | 1900° C. hot press | |
| 4 | 25 | 0 | WC | 75 | 1900° C. hot press | |
| 5 | 25 | 0 | WC + TaC (note) | 75 | 1900° C. hot press | |
| 6 | 30 | 20 | TiN | 50 | 1800° C. hot press | |
| 7 | 30 | 0 | NbC | 70 | 1800 v hot press | |
| 8 | 30 | 0 | TiC | 70 | 1800° C. hot press | |
| 9 | 30 | 0 | TiN | 70 | 1800° C. hot press | |
| 10 | 40 | 60 | — | 0 | 1650 | 1600 |
| 11 | 40 | 20 | TiN | 40 | 1700 | 1900 |
| 12 | 40 | 0 | ZrC | 60 | 1700 | 1900 |
| 13 | 40 | 0 | WC | 60 | 1600 | 1600 |
| 14 | 40 | 0 | TiCN | 60 | 1700 | 1900 |
| 15 | 45 | 20 | TiC | 35 | 1650 | 1600 |
| 16 | 45 | 0 | TiCN | 55 | 1650 | 1600 |
| 17 | 45 | 0 | TiB$_2$ | 55 | 1700° C. hot press | |
| 18 | 45 | 0 | TiN | 55 | 1650 | 1900 |
| 19 | 45 | 0 | WC | 55 | 1600 | 1700 |
| 20 | 50 | 50 | — | 0 | 1600 | 1600 |
| 21 | 50 | 20 | NbC | 30 | 1650 | 1700 |
| 22 | 50 | 0 | TiCN | 50 | 1600 | 1700 |
| 23 | 50 | 0 | TiN | 50 | 1600 | 1700 |
| 24 | 50 | 0 | TiC | 50 | 1600 | 1700 |
| 25 | 55 | 45 | — | 0 | 1550 | 1500 |
| 26 | 55 | 20 | TiN | 25 | 1600 | 1700 |
| 27 | 55 | 0 | TaC | 45 | 1600 | 1700 |
| 28 | 55 | 0 | ZrC | 45 | 1600 | 1700 |
| 29 | 55 | 0 | TiN | 45 | 1600 | 1700 |

*1: Volume % for zirconia system phase
*2: Volume % for alumina system phase
*3: Electroconductive inorganic compound phase
☆ Hot press is one step sintering

TABLE 2

| | Composition | | | | Sintering condition | |
|---|---|---|---|---|---|---|
| | *1 Zirconia | *2 Alumina | *3 Second phase ingredient | | Primary sintering tempera- | HIP sintering Tempera- |
| | vol % | vol % | Kind | Vol % | ture (° C.) | ture (° C.) |
| 30 | 60 | 40 | — | 0 | 1550 | 1500 |
| 31 | 60 | 20 | TiN | 20 | 1600 | 1600 |
| 32 | 60 | 0 | TiC | 40 | 1600 | 1600 |
| 33 | 60 | 0 | TiN | 40 | 1600 | 1600 |
| 34 | 60 | 0 | WC | 40 | 1600 | 1600 |
| 35 | 65 | 35 | — | 0 | 1550 | 1500 |
| 36 | 65 | 20 | TiCN | 15 | 1550 | 1550 |
| 37 | 65 | 0 | TiN | 35 | 1550 | 1450 |
| 38 | 65 | 0 | TiC | 35 | 1600 | 1450 |
| 39 | 65 | 0 | TaC | 35 | 1600 | 1600 |
| 40 | 65 | 0 | NbC | 35 | 1600 | 1600 |
| 41 | 65 | 0 | WC | 35 | 1600 | 1600 |
| 42 | 70 | 30 | — | 0 | 1500 | 1450 |
| 43 | 70 | 20 | TiN | 10 | 1500 | 1450 |
| 44 | 70 | 0 | ZrC | 30 | 1550 | 1500 |
| 45 | 70 | 0 | TaC | 30 | 1550 | 1500 |
| 46 | 70 | 0 | WC | 30 | 1500 | 1450 |
| 47 | 70 | 0 | TiN | 30 | 1500 | 1450 |
| 48 | 70 | 0 | TiCN | 30 | 1500 | 1450 |
| 49 | 70 | 0 | TiB$_2$ | 30 | 1600 | 1600 |
| 50 | 75 | 0 | TiN | 25 | 1500 | 1450 |

TABLE 2-continued

|  | Composition | | | Sintering condition | |
|---|---|---|---|---|---|
|  | *1 Zirconia vol % | *2 Alumina vol % | *3 Second phase ingredient Kind | *3 Second phase ingredient Vol % | Primary sintering tempera- ture (° C.) | HIP sintering Tempera- ture (° C.) |
| 51 | 80 | 20 | — | 0 | 1400 | 1450 |
| 52 | 80 | 0 | TiN | 20 | 1400 | 1450 |

*1 Volume % for zirconia system phase
*2 Volume % for alumina system phase
*3 Electroconductive inorganic compound phase

TABLE 3

|  | Average grain size (μm) | Zirconia series phase crystal structure | | | |
|---|---|---|---|---|---|
|  |  | Monoclinic (wt %) MW | Tetragonal (wt %) TW | Cubic (wt %) CW | CW/TW |
| 1 | 3.82 | 15.7 | 71.1 | 13.2 | 0.19 |
| 2 | 1.80 | 6.8 | 76.3 | 16.9 | 0.22 |
| 3 | 0.82 | 17.6 | 62.3 | 20.1 | 0.32 |
| 4 | 3.50 | 5.9 | 88.9 | 5.2 | 0.06 |
| 5 | 2.90 | 2.2 | 90.5 | 7.3 | 0.08 |
| 6 | 2.41 | 8.4 | 79.8 | 11.8 | 0.15 |
| 7 | 0.62 | 11.9 | 64.5 | 23.6 | 0.37 |
| 8 | 2.30 | 1.1 | 92.4 | 6.5 | 0.07 |
| 9 | 4.20 | 2.1 | 95.3 | 2.6 | 0.03 |
| 10 | 1.20 | 5.9 | 84.4 | 9.7 | 0.11 |
| 11 | 2.21 | 0.9 | 96.7 | 2.4 | 0.02 |
| 12 | 0.75 | 22.2 | 52.2 | 25.6 | 0.49 |
| 13 | 1.57 | 15.1 | 65.5 | 19.4 | 0.30 |
| 14 | 1.80 | 4.3 | 80.2 | 15.5 | 0.19 |
| 15 | 0.91 | 6.2 | 75.1 | 18.7 | 0.25 |
| 16 | 2.76 | 9.4 | 77.0 | 13.6 | 0.18 |
| 17 | 2.90 | 1.3 | 97.6 | 1.1 | 0.01 |
| 18 | 3.13 | 1.5 | 96.2 | 2.3 | 0.02 |
| 19 | 0.90 | 24.2 | 62.0 | 13.8 | 0.22 |
| 20 | 2.22 | 1.9 | 94.2 | 3.9 | 0.04 |
| 21 | 0.42 | 14.6 | 55.5 | 29.9 | 0.54 |
| 22 | 3.50 | 2.1 | 94.4 | 3.5 | 0.04 |
| 23 | 2.00 | 3.9 | 93.4 | 2.7 | 0.03 |
| 24 | 0.69 | 20.2 | 68.9 | 10.9 | 0.16 |
| 25 | 0.58 | 8.2 | 81.0 | 10.8 | 0.13 |
| 26 | 1.20 | 15.3 | 70.5 | 14.2 | 0.20 |
| 27 | 0.45 | 18.4 | 54.2 | 27.4 | 0.51 |
| 28 | 0.30 | 9.1 | 81.3 | 9.6 | 0.12 |
| 29 | 1.46 | 5.0 | 78.4 | 16.6 | 0.21 |

TABLE 4

|  | Average grain size (μm) | Zirconia series phase crystal structure | | | |
|---|---|---|---|---|---|
|  |  | Monoclinic (wt %) MW | Tetragonal (wt %) TW | Cubic (wt %) CW | CW/TW |
| 30 | 0.83 | 21.0 | 64.0 | 15.0 | 0.23 |
| 31 | 1.64 | 2.0 | 93.2 | 4.8 | 0.05 |
| 32 | 0.76 | 9.3 | 83.6 | 7.1 | 0.08 |
| 33 | 1.20 | 0.7 | 97.7 | 1.6 | 0.02 |
| 34 | 0.42 | 4.8 | 73.0 | 22.2 | 0.30 |
| 35 | 0.90 | 2.4 | 95.9 | 1.7 | 0.02 |
| 36 | 0.55 | 5.2 | 86.4 | 8.4 | 0.10 |
| 37 | 1.32 | 1.4 | 95.6 | 3.0 | 0.03 |
| 38 | 0.85 | 2.2 | 94.2 | 3.6 | 0.04 |
| 39 | 0.26 | 14.2 | 59.7 | 26.1 | 0.44 |
| 40 | 0.13 | 13.9 | 55.8 | 30.3 | 0.54 |
| 41 | 0.91 | 2.1 | 93.8 | 4.1 | 0.04 |
| 42 | 0.34 | 3.3 | 95.2 | 1.5 | 0.02 |
| 43 | 0.47 | 3.3 | 94.0 | 2.7 | 0.03 |

TABLE 4-continued

|  | Average grain size (μm) | Zirconia series phase crystal structure | | | |
|---|---|---|---|---|---|
|  |  | Monoclinic (wt %) MW | Tetragonal (wt %) TW | Cubic (wt %) CW | CW/TW |
| 44 | 0.35 | 7.8 | 84.9 | 7.3 | 0.09 |
| 45 | 0.17 | 0.4 | 82.2 | 17.4 | 0.21 |
| 46 | 0.58 | 6.2 | 90.5 | 3.3 | 0.04 |
| 47 | 0.27 | 6.2 | 91.8 | 2.0 | 0.02 |
| 48 | 0.22 | 2.3 | 88.7 | 9.0 | 0.10 |
| 49 | 0.19 | 2.2 | 96.0 | 1.8 | 0.02 |
| 50 | 0.24 | 1.5 | 93.8 | 4.7 | 0.05 |
| 51 | 0.11 | 0.5 | 94.3 | 5.2 | 0.06 |
| 52 | 0.15 | 2.3 | 96.3 | 1.4 | 0.01 |

TABLE 5

|  | Fracture toughness value (MPa · m$^{1/2}$) | Result of shape measurement C or R (mm) | Top end width of edge (mm) | Result of surface roughness measurement Rmax (μm) | Result of chipping resistance evaluation |
|---|---|---|---|---|---|
| 1 | 2.51 | C0.123 | 0.174 | 71.8 | Δ |
| 2 | 3.14 | C0.109 | 0.154 | 58.2 | Δ |
| 3 | 3.21 | R0.165 | 0.233 | 134.8 | x |
| 4 | 3.23 | C0.069 | 0.098 | 42.5 | ○ |
| 5 | 3.37 | R0.038 | 0.054 | 30.0 | ○ |
| 6 | 3.49 | C0.159 | 0.225 | 85.5 | Δ |
| 7 | 3.56 | R0.153 | 0.216 | 102.7 | x |
| 8 | 3.61 | R0.078 | 0.110 | 47.2 | ○ |
| 9 | 3.63 | C0.035 | 0.049 | 15.4 | ● |
| 10 | 4.66 | R0.081 | 0.115 | 40.1 | ○ |
| 11 | 4.85 | R0.011 | 0.016 | 6.9 | ● |
| 12 | 3.82 | C0.201 | 0.284 | 77.7 | x |
| 13 | 4.13 | R0.112 | 0.158 | 61.0 | Δ |
| 14 | 3.93 | R0.094 | 0.133 | 22.2 | ○ |
| 15 | 3.95 | R0.161 | 0.228 | 138.1 | x |
| 16 | 4.03 | R0.049 | 0.069 | 28.5 | ○ |
| 17 | 4.03 | R0.023 | 0.033 | 8.4 | ● |
| 18 | 4.14 | R0.039 | 0.055 | 4.1 | ● |
| 19 | 4.18 | R0.091 | 0.129 | 57.9 | Δ |
| 20 | 6.00 | C0.011 | 0.016 | 10.0 | ● |
| 21 | 4.24 | C0.183 | 0.259 | 182.0 | x |
| 22 | 4.52 | R0.017 | 0.024 | 17.9 | ● |
| 23 | 4.73 | R0.020 | 0.028 | 7.2 | ● |
| 24 | 4.55 | R0.134 | 0.190 | 62.4 | Δ |
| 25 | 6.12 | C0.053 | 0.075 | 33.1 | ○ |
| 26 | 5.41 | C0.066 | 0.093 | 40.2 | ○ |
| 27 | 5.04 | C0.177 | 0.250 | 89.9 | x |
| 28 | 8.00 | R0.073 | 0.103 | 47.9 | ○ |
| 29 | 5.12 | R0.086 | 0.122 | 28.4 | ○ |

TABLE 6

|  | Fracture toughness value (MPa · m$^{1/2}$) | Result of shape measurement C or R (mm) | Top end width of edge (mm) | Result of surface roughness measurement Rmax (μm) | Result of chipping resistance evaluation |
|---|---|---|---|---|---|
| 30 | 5.12 | R0.127 | 0.180 | 76.6 | Δ |
| 31 | 5.80 | R0.016 | 0.023 | 3.5 | ● |
| 32 | 5.55 | R0.106 | 0.150 | 21.9 | ○ |
| 33 | 6.21 | C0.041 | 0.058 | 12.5 | ● |
| 34 | 5.66 | C0.104 | 0.147 | 92.5 | Δ |
| 35 | 6.26 | R0.013 | 0.018 | 2.9 | ● |
| 36 | 7.36 | R0.064 | 0.091 | 18.2 | ○ |
| 37 | 7.07 | R0.021 | 0.030 | 5.8 | ● |
| 38 | 8.97 | R0.014 | 0.020 | 8.6 | ● |
| 39 | 6.35 | R0.132 | 0.187 | 91.4 | x |
| 40 | 7.07 | C0.155 | 0.219 | 116.3 | x |
| 41 | 7.19 | R0.007 | 0.010 | 4.7 | ● |

TABLE 6-continued

| | Fracture toughness value (MPa · m^{1/2}) | Result of shape measurement C or R (mm) | Top end width of edge (mm) | Result of surface roughness measurement Rmax (μm) | Result of chipping resistance evaluation |
|---|---|---|---|---|---|
| 42 | 10.15 | R0.011 | 0.016 | 10.6 | ● |
| 43 | 12.10 | C0.020 | 0.028 | 2.6 | ● |
| 44 | 8.90 | C0.042 | 0.059 | 36.5 | ○ |
| 45 | 8.13 | R0.137 | 0.194 | 68.8 | Δ |
| 46 | 8.56 | R0.028 | 0.040 | 3.3 | ● |
| 47 | 10.26 | R0.011 | 0.016 | 7.4 | ● |
| 48 | 10.50 | R0.058 | 0.082 | 15.2 | ○ |
| 49 | 12.05 | C0.030 | 0.042 | 5.1 | ● |
| 50 | 12.21 | R0.008 | 0.011 | 2.8 | ● |
| 51 | 12.71 | R0.097 | 0.137 | 17.7 | ○ |
| 52 | 12.81 | R0.013 | 0.018 | 2.4 | ● |

Then, FIG. 1 shows the result of measurement for the fracture toughness value KC to each of test specimens with respect to the result of Table 1 to Table 6, and FIG. 1 also shows the result of plotting to the result of measurement for the average grain size d. It can be seen therefrom that each boundary between the data point "x" and the data point "c", between the data point "Δ" and the data point "○" and between the data point "○" and the data point "●" is sectioned by a function curve of KC=B·d$^A$ type. Further, it can be seen that within a range of A from −0.41 to −0.37, a correlationship is established between the constant B and easy or less easy chipping upon forming the sharp edge portion, specifically, that the result is improved successively as "Δ" for 4 or more, "○" for 5 or more, further, "●" for 6 or more, regarding B. Further, it can also be seen that chipping property is particularly excellent when CW/TW is less than 1.

What is claimed is:

1. An edged ceramic member comprising a zirconia-containing ceramic material containing 20% by volume or more of a zirconia series ceramic phase mainly composed of a zirconium oxide, in which:

the zirconia-containing ceramic material satisfies:

$$KC/(d^A) \geq 5$$

where the exponential value A is a number set within the range of from −0.41 to −0.37, d being the average grain size in μm and KC being the fracture toughness value in MPa·m$^{1/2}$ thereof;

the member comprising one or more edge portions, each present in the form of a ridge at an intersection between two edge forming surfaces, wherein at least one of the edge portions is formed as a sharp edge portion having a top end width for the edge of 0.15 mm or less present on a cross section taken along an arbitrary plane perpendicular to the direction of the ridge, the surface roughness of the sharp edge portion at the top end of the edge has a maximum height of 70 μm or less as measured in the direction of the ridge, one or more of Ca, Y, Ce and Mg are contained as a stabilizing ingredient for the zirconia series ceramic phase within a range from 1.4 to 4 mol % as a proportion of the total of the content in the zirconia series ceramic phase, being expressed as the value of an oxide, that is, of CaO for Ca, $Y_2O_3$ for Y, $CeO_2$ for Ce and MgO for Mg, the ratio CW/TW between the weight CW for the cubic system phase and the weight TW for the tetragonal system phase in the zirconia ceramic phase is less than 1, the zirconia-containing ceramic material is a composite ceramic material in which the matrix ceramic phase constituting a remaining portion of the zirconia series ceramic phase mainly comprises an electroconductive inorganic compound, and the electroconductive inorganic compound is at least one of metal nitrides, metal carbides, metal borides, metal carbonitrides and tungsten carbide having at least one of Ti, Zr, Nb and Ta as the metal cationic ingredient.

2. An edged ceramic member as defined in claim 1, wherein the proportion of zirconia series ceramic phase in the zirconia-containing ceramic material is from 60 to 98.5% by volume.

3. An edged ceramic member as defined in claim 1, wherein the edged ceramic member is a ceramic working tool for use in shearing, cutting, bending or deep drawing by using the sharp edge portion as a portion for applying a working force.

4. An edged ceramic member as defined in claim 3, wherein the ceramic working tool is a punching tool for manufacturing lead frames.

5. A method of manufacturing an edged ceramic member comprising the step of:

applying grinding to the outer surface of a zirconia-containing ceramic material containing 20% by volume or more of a zirconia series ceramic phase mainly composed of a zirconium oxide and satisfying:

$$KC/(d^A) \geq 5$$

where the exponential value A is a number set within the range of from −041 to −0.37, d being the average grain size in μm and KC being the fracture toughness value in MPa·m$^{1/2}$ of the material, thereby forming a sharp edge portion present in the form of a ridge at an intersection between two edge forming surfaces having a top end width for the edge of 0.15 mm or less present on a cross section taken along an arbitrary plane perpendicular to the direction of the ridge and having a maximum height of 70 μm or less as the surface roughness on the top end surface of the edge as measured in the direction of the ridge, one or more of Ca, Y, Ce and Mg are contained as a stabilizing ingredient for the zirconia series ceramic phase within a range from 1.4 to 4 mol % as a proportion of the total of the content in the zirconia series ceramic phase, being expressed as the value of an oxide, that is, of CaO for Ca, $Y_2O_3$ for Y, $CeO_2$ for Ce and MgO for Mg, the ratio CW/TW between the weight CW for the cubic system phase and the weight TW for the tetragonal system phase in the zirconia ceramic phase is less than 1, the zirconia-containing ceramic material is a composite ceramic material in which the matrix ceramic phase constituting a remaining portion of the zirconia series ceramic phase mainly comprises an electroconductive inorganic compound, and the electroconductive inorganic compound is at least one of metal nitrides, metal carbides, metal borides, metal carbonitrides and tungsten carbide having at least one of Ti, Zr, Nb and Ta as the metal cationic ingredient.

6. A method of manufacturing an edged ceramic member comprising the steps of:

applying grinding to the outer surface of a zirconia-containing ceramic material containing 20% by volume or more of a zirconia series ceramic phase mainly composed of a zirconium oxide thereby forming one or more edge portions present in the form of a ridge at an intersection between two edge forming surfaces; and measuring an average grain size d in μm and a fracture toughness value KC in MPa·m$^{1/2}$ of the zirconia containing ceramic material before grinding, and then applying grinding only to the zirconia-containing ceramic material having d and KC satisfying:

$$(KC/(d^A) \geqq 5$$

where the exponential value A is a number set within the range of from −0.41 to −0.37, said edged ceramic member comprising a zirconia-containing ceramic material containing 20% by volume or more of a zirconia series ceramic phase mainly composed of a zirconium oxide, in which:

the zirconia-containing ceramic material satisfies:

$$KC/(d^A) \geqq 5$$

where the exponential value A is a number set within the range of from −0.41 to −0.37, d being the average grain size in μm and KC being the fracture toughness value in MPa·m$^{1/2}$ thereof;

the member comprising one or more edge portions, each present in the form of a ridge at an intersection between two edge forming surfaces, wherein at least one of the edge portions is formed as a harp edge portion having a top end width for the edge of 0.15 nm or less present on a cross section taken along an arbitrary plane perpendicular to the direction of the ridge, the surface roughness of the sharp edge portion at the top end of the edge has a maximum height of 70 μm or less as measured in the direction of the ridge, one or more of Ca, Y, Cc and Mg are contained as a stabilizing ingredient for the zirconia series ceramic phase within a range from 1.4 to 4 mol % as a proportion of the total of the content in the zirconia series ceramic phase, being expressed as the value of an oxide, that is, of CaO for Ca, $Y_2O_3$ for Y, $CeO_2$ for Ce and MgO for Mg, the ratio CW/TW between the weight CW for the cubic system phase and the weight TW for the tetragonal system phase in the zirconia ceramic phase is less than 1, the zirconia-containing ceramic material is a composite ceramic material in which the matrix ceramic phase constituting a remaining portion of the zirconia series ceramic phase mainly comprises an electroconductive inorganic compound, and the electroconductive inorganic compound is at least one of metal nitrides, metal carbides, metal borides, metal carbonitrides and tungsten carbide having at least one of Ti, Zr, Nb and Ta as the metal cationic ingredient.

* * * * *